United States Patent [19]

Vander Mey

[11] 4,242,218
[45] Dec. 30, 1980

[54] PHENOL-FREE PHOTORESIST STRIPPER

[75] Inventor: John E. Vander Mey, Stirling, N.J.

[73] Assignee: Allied Chemical Corporation, Morris Township, Morris County, N.J.

[21] Appl. No.: 740,154

[22] Filed: Nov. 8, 1976

Related U.S. Application Data

[63] Continuation-in-part of Ser. No. 689,718, May 24, 1976, abandoned, which is a continuation of Ser. No. 601,574, Aug. 1, 1975, abandoned.

[51] Int. Cl.$^2$ .................... C23G 5/02; G03C 11/12
[52] U.S. Cl. .................... 252/143; 134/3; 134/38; 134/40; 134/42; 252/162; 252/171; 252/558
[58] Field of Search .............. 252/162, 143, 171, 142, 252/558, 549; 134/3, 38, 40, 42

[56] References Cited

U.S. PATENT DOCUMENTS

| | | | |
|---|---|---|---|
| 2,083,013 | 6/1937 | Freeman | 252/143 X |
| 3,075,923 | 1/1963 | Berst et al. | 252/143 X |
| 3,289,577 | 12/1966 | Uhlig | 252/DIG. 17 X |
| 3,357,828 | 12/1967 | Moe | 252/162 X |
| 3,578,591 | 5/1971 | Lazaridis et al. | 252/549 X |
| 3,582,401 | 6/1971 | Berilla et al. | 252/143 X |
| 3,629,004 | 12/1971 | Cooper et al. | 252/143 X |
| 3,714,075 | 1/1973 | Johnson | 252/558 X |
| 3,871,929 | 3/1975 | Schevey et al. | 96/36.2 X |
| 3,925,231 | 12/1975 | Ritzi | 252/171 X |
| 3,929,680 | 12/1975 | Arai et al. | 252/558 X |
| 3,988,256 | 10/1976 | Vander Mey et al. | 252/171 |
| 4,070,203 | 1/1978 | Neisius et al. | 252/143 X |

Primary Examiner—Harris A. Pitlick
Attorney, Agent, or Firm—Alan M. Doernberg; Jay P. Friedenson

[57] ABSTRACT

Stripping solutions, free from phenol compounds, comprising at least 30 weight percent of an unsubstituted or alkyl substituted aryl sulfonic acid have been found effective for removal of organic polymeric substances from inorganic substrates. The novel compositions comprise 30–80 percent of one or more of the sulfonic acids in admixture with chlorinated aryl compounds, alkylaryl compounds having 1–14 alkyl carbons, an isoparaffinic hydrocarbon, or mixtures thereof.

22 Claims, No Drawings

PHENOL-FREE PHOTORESIST STRIPPER

CROSS-REFERENCE TO RELATED APPLICATIONS

This application is a continuation-in-part of application Ser. No. 689,718, filed May 24, 1976, now abandoned which was a continuation of application Ser. No. 601,574, filed Aug. 1, 1975, now abandoned.

BACKGROUND OF THE INVENTION

During manufacture of semiconductors and semiconductor microcircuits, it is frequently necessary to coat the materials from which the semiconductors and microcircuits are manufactured with a polymeric organic substance, generally referred to as a photoresist, e.g., a substance which forms an etch resist upon exposure to light. These photoresists are used to protect selected areas of the surface of the substrate, e.g. silicon, $SiO_2$ or aluminum, from the action of the etching solution, while such etchant selectively attacks the unprotected area of the substrate. Following completion of the etching operation and washing away of the residual etchant, it is necessary that the resist be removed from the protective surface to permit essential finishing operations.

A common method used in removing the photoresist from the substrate is by contacting the substract with an organic stripper. Heretofore these organic strippers have been composed of various components whose purpose it was to lift and remove the polymeric photoresist from the substrate. However, these stripping solutions have heretofore contained phenol or phenol compounds. The use of phenol or phenol compounds results in a distinct disadvantage due to the toxicity of phenol as well as the pollution problems arising from the disposal of phenol or phenol compounds such as cresols, phenol sulfonic acid and the like.

It is an object of this invention to provide an effective photoresist stripping solution which is essentially free of phenol and phenol compounds.

It is an additional object of this invention to provide a method for removing photoresist polymeric coatings from inorganic substrates with a stripping solution free from phenol and phenol compounds.

These and other objects will become apparent from the description which follows.

BRIEF DESCRIPTION OF THE INVENTION

Briefly, in accordance with this invention, there is provided a stripping solution for removing polymeric organic substances from an inorganic substrate, said solution being essentially free of phenol compounds and comprising 30-80 weight percent of one or more aryl sulfonic acids having the formula

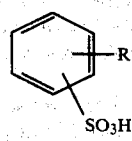

wherein R is hydrogen or an alkyl group containing 1 to 14 carbon atoms, in admixture with 20-70 weight percent of a solvent which is chlorinated aryl compounds, alkylaryl compounds having 1-14 alkyl carbons, or isoparaffinic hydrocarbon having an average molecular weight between 150 and 210 and a boiling point between 160° and 220° C., or mixtures thereof. The solvent includes a chlorinated aryl compound. In preferred forms, at least 10 weight percent of the solution is alkylaryl.

Also in accordance with this invention, there is provided a method for removing a photoresist organic polymeric coating material from the surface of an inorganic substrate which comprises contacting said coated substance for a time sufficient to loosen said coating with a stripping composition containing at least 30 weight percent of the aryl sulfonic acid defined above and which composition is essentially free of phenol compounds.

DETAILED DESCRIPTION OF THE INVENTION

The present invention provides a composition which is effective in removing photoresist, and a method for removing photoresist from inorganic substrates, without the use of phenol or phenol compounds and their corresponding disadvantages. Surprisingly, it has been found that the aryl sulfonic acid itself acts effectively as a photoresist stripper. This is unexpected in the sense that the prior art relating to such stripping solutions employed such compounds in their compositions as surface active agents and yet felt that phenol or phenol compounds were necessary to effectively remove the photoresist from the substrate.

The aryl sulfonic acids which have been found to be effective, per se, for removing organic photoresist are those represented by the formula

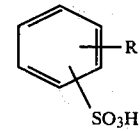

wherein R is hydrogen or a straight or branched chain alkyl group containing 1 to 14 carbon atoms. Exemplary of such aryl sulfonic acids suitable for use in accordance with the present invention are benzene sulfonic acid, toluene sulfonic acid, heptylbenzene sulfonyl acid, octylbenzene sulfonic acid, decylbenzene sulfonic acid, dodecylbenzene sulfonic acid, cumene sulfonic acid, and the like.

Blends of these sulfonic acids may also be employed. Preferred blends include dodecylbenzene sulfonic acid and toluene sulfonic acid.

Solutions containing a major proportion of higher sulfonic acid, which is particularly dodecylbenzene sulfonic acid, and 5-10 weight percent toluene sulfonic acid are among the preferred blends.

The preferred aryl sulfonic acid for use in accordance with this invention is dodecylbenzene sulfonic acid, although cumene sulfonic acid has also been found to be particularly effective. While, as stated above, the aryl sulfonic acids can be used alone in the removal of organic photoresists, it has been found that sometimes the viscosity of the sulfonic acids is fairly high and it is thus desirable to lower the viscosity to reduce the quantity of mateial that is taken out of the stripping solution upon removal of the substrate after treatment with the stripping solution. The viscosity of the aryl sulfonic acid can be reduced by the addition of a solvent. In fact, in some cases it is desirable to employ the aryl sulfonic acid in conjunction with the solvent. The solvent or solvent systems which are to be used must be materials which do not deter from the stripping effectiveness of the aryl sulfonic acid. The solvent or solvent system itself is not critical to the stripping, i.e., the function of the sulfonic acid, since the function of the solvent is merely to reduce the viscosity and to render the sulfonic acid more readily water rinsable. Of course, the solvent should be miscible with the sulfonic acid and not react therewith and the most desirable solvents are those which do not induce corrosion on materials such as aluminum. Within these guidelines, it has been found that solvents employed in conjunction with the aryl sulfonic acids in accordance with this invention may be perchloroethylene, chlorinated aryl compounds such as dichlorobenzene, alkylaryl compounds such as dodecylbenzene or an isoparaffinic hydrocarbon having an average molecular weight between 150 and 210 and a boiling point between 160° and 220° C. The isoparaffinic hydrocarbons suitable for use as solvents in accordance with this invention are relatively high boiling narrow cut isoparaffinic solvents and are produced by modern synthesis from selected petroleum-derived raw materials. They may be straight or branched chained as long as they fall within the selected parameters. Typical isoparaffinic hydrocarbons are available under the trade name Isopar and can be generally characterized as containing about 60 percent of C-11 compounds, 20 percent of C-10 compounds and 20 percent of C-12 compounds.

Among the preferred components of the solvent are alkylaryl compounds having 1–14 alkyl carbons. Considering the more common mono-, di-, tri- and tetra-substituted benzenes, these alkylaryl compounds may be represented by the formula

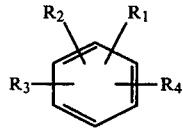

wherein $R_1$ is an alkyl group, $R_2$, $R_3$ and $R_4$ are independently hydrogen or an alkyl group and $R_1$, $R_2$, $R_3$ and $R_4$ together contain 1–14 carbon atoms. Each alkyl group may be straight or branched, but the straight-chain alkyl groups are preferred for biodegradability. The most preferred examples of such compounds are toluene, xylene, ethylbenzene, trimethylbenzene, cumene, phenyl octane and dodecylbenzene. Other preferred examples include phenyl nonane, tridecylbenzene, tridecyltoluene and triethylbenzene. Suitable compounds are illustrated in Table 4 below.

The composition preferably contains 10–70 weight percent alkylaryl compound or compounds, and more preferably 25–55 weight percent alkylaryl compounds. For example, 10–70 weight percent, and more preferably 25–55 weight percent of the preferred dodecylbenzene may be used.

In some preferred forms, the solution is free of halogenated hydrocarbons such as perchloroethylene and dichlorobenzene. Such solutions are generally biodegradable as compared to solutions containing halogenated hydrocarbons. However, in other preferred forms, up to 30 weight percent and preferably 10–20 weight percent of the solution is halogenated hydrocarbon, containing for example perchloroethylene, dichlorobenzene or mixtures thereof.

Many of the preferred compositions do include chlorinated aryl compounds such as dichlorobenzene, with the preferred compounds represented by the formula

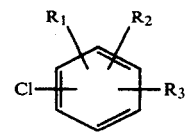

where $R_1$, $R_2$ and $R_3$ are each independently H, Cl or alkyl, and $R_1$, $R_2$ and $R_3$ together have 0–5 carbons. The more preferred chlorinated aryl compounds are dichlorobenzene and trichlorobenzene, with dichlorobenzene being most preferred.

Of course other solvents may also be used, including chlorinated aliphatic hydrocarbons such as perchloroethylene. However, such other components are preferred only with at least 20% of a solvent from the above-listed group.

Many preferred compositions include blends of solvents for the one or more aryl sulfonic acid. An exemplary preferred solution would include dodecylbenzene sulfonic acid, toluene sulfonic acid, dodecylbenzene, dichlorobenzene and perchloroethylene.

The polymeric organic substances which are to be removed by the stripping solutions of this invention are photoresist which generally comprise polymers selected from relatively low molecular weight polyisoprenes, polyvinyl cinnamates and phenol formaldehyde resins. These photoresists are applied to a substrate, e.g., $SiO_2$, silicon or aluminum and portions are masked. The masked substrate is then exposed to light, e.g., a 120 volt 650 watt quartz lamp for 1–15 seconds at a distance of 6–12 inches to harden the exposed photoresist. The portion of the photoresist which is not exposed, i.e., masked from the light, is then removed by a mild solvent which does not dissolve the exposed photoresist thus leaving a pattern, e.g., a portion of an electrical circuit pattern, on the exposed substrate. The remaining photoresist is then baked for further hardening and the portion of the substrate which is not covered by the photoresist is etched or otherwise treated. The hardened photoresist must then be removed before the substrate can be further processed or used. In employing the stripping solutions of this invention, the substrate covered with the baked photoresist is contacted with the stripping solution at a temperature of from about 50° to about 180° C., preferably between 90° and 120° C. Times required for stripping the photoresist vary to quite an extent, depending on the specific polymer used in the photoresist and photoresist processing conditions. Generally, the time involved will be between 1 and 10 minutes although some resists, depending upon the bake temperature, may require 15 minutes, 30 minutes or even an hour of contact with the stripping solution before the polymeric photoresist is loosened from the substrate.

After the photoresist has been stripped from the substrate, the substrate is rinsed in any suitable liquid. Examples of suitable rinsing liquids are: ethanol, isopropyl alcohol, trichloroethylene, perchloroethylene, methylene chloride and water.

When the aryl sulfonic acid is employed in conjunction with a solvent, it is necessary to use at least 30 percent of the sulfonic acid in such an admixture. The amount of solvent employed should be at least about 20 weight percent of the admixture since amounts lower than 20 percent do not effectively function as a viscosity reducer. Thus, the compositions of this invention comprise an aryl sulfonic acid having the formula

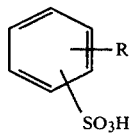

wherein R is as defined above, in an amount between 30 and 80 weight percent, in admixture with 20-70 weight percent of a solvent as specified above. The preferred amount of aryl sulfonic acid is between 40-70 weight percent, and correspondingly, the preferred amount of solvent is between 30-60 weight percent.

DESCRIPTION OF THE PREFERRED EMBODIMENTS

Examples 1-17

A silicon dioxide substrate was coated with various organic photoresists and baked at various temperatures before treatment in accordance with this invention. The photoresist, the bake temperature, the stripping time and the stripping composition are indicated in Table I.

Examples of suitable alkylaryl compounds are shown in Table 4.

Examples of suitable chlorinated aryl compounds are shown in Table 5.

TABLE 2

| Example # | DDBSA | TSA | Alkylaryl Compound(s) | Other Solvent(s) |
|---|---|---|---|---|
| 18 wt % | 45 | 10 | Phenyloctane 45 | |
| 19 wt % | 45 | 8 | Phenyloctane 33 | ODCB 14 |
| 20 wt % | 45 | 5 | Phenyloctane 25 | ODCB PCE 10 20 |
| 21 wt % | 60 | | Toluene 40 | |
| 22 wt % | 45 | | Ethylbenzene 55 | |
| 23 wt % | 50 | | Cumene 50 | |
| 24 wt % | 55 | | Xylene 45 | |
| 25 wt % | 60 | | DDB DEB 20 20 | |
| 26 wt % | 55 | | TMB 45 | |

DDBSA = Docecylbenzene sulfonic acid;
TSA = toluene sulfonic acid;
ODCB = orthodichlorobenzene;
PCE = perchloroethylene;
DDB = dodecylbenzene;
DEB = diethylbenzene;
TMB = trimethylbenzene

TABLE I

| EXAMPLE # | PHOTORESIST | BAKE TEMP. °C.* | STRIPPING COMPOSITION | STRIPPING TIME (MINUTES) AT 100° C. |
|---|---|---|---|---|
| 1. | Polyisoprene | 150 | DodecylBenzene Sulfonic Acic (DDBSA) | 5 |
| 2. | Polyisoprene | 220 | DodecylBenzene Sulfonic Acid (DDBSA) | 15** |
| 3. | Polyisoprene | 150 | DodecylBenzene Sulfonic Acid (DDBSA) | 5 |
| 4. | Polyisoprene | 185 | DodecylBenzene Sulfonic Acid (DDBSA) | 7 |
| 5. | Polyisoprene | 150 | DodecylBenzene Sulfonic Acid (DDBSA) | 5 |
| 6. | Polyvinyl Cinnamate | 150 | DodecylBenzene Sulfonic Acid (DDBSA) | 5 |
| 7. | Polyvinyl Cinnamate | 185 | DodecylBenzene Sulfonic Acid (DDBSA) | 10** |
| 8. | Polyvinyl Cinnamate | 220 | DodecylBenzene Sulfonic Acid (DDBSA) | 45 |
| 9. | Phenol Formaldehyde | 150 | DodecylBenzene Sulfonic Acid (DDBSA) | 10 |
| 10. | Phenol Formaldehyde | 185 | DodecylBenzene Sulfonic Acid (DDBSA) | 5** |
| 11. | Phenol Formaldehyde | 150 | Cumene Sulfonic Acid | 8 |
| 12. | Polyisoprene | 150 | Cumene Sulfonic Acid | 5 |
| 13. | Polyisoprene | 150 | 40% DDBSA + 60% Dodecylbenzene | 5 |
| 14. | Polyisoprene | 150 | 40% DDBSA + 50% Isopar M*** | 5 |
| 15. | Polyisoprene | 150 | 50% DDBSA + 50% Isopar M*** | 5 |
| 16. | Phenol Formaldehyde | 150 | 50% DDBSA + 50% ortho dichlorobenzene | 5 |
| 17. | Polyvinyl Cinnamate | 150 | 50% DDBSA + 50% perchloroethylene | 5 |

*30-60 minutes
**Stripping Temperature was 115° C.
***An isoparaffinic solvent sold by Exxon Co. having an average molecular weight of 191 and a b.p. between 125 and 210° C.

As Table I indicates, very effective results are achieved in employing an aryl sulfonic acid in accordance with this invention either alone, or in conjunction with a solvent, to remove polymeric photoresist from inorganic substrates. Although Example No. 8 required more than 45 minutes for complete removal of the polymer from the substrate, the polyvinyl cinnamate baked at 220° C. is particularly difficult to remove and the use of DDBSA alone compares favorably with prior art strippers in this regard.

EXAMPLES 18-26

A silicon dioxide substrate was coated with five different organic photoresists at 150° C. for 30 minutes before treatment according to this invention. The stripping solutions of Examples 18-26 are shown in Table 2. The stripping time of each photoresist for each example is shown in Table 3.

TABLE 3

| Stripping time in minutes Composition of Example # | Photoresist baked at 150° C. for 30 minutes | | | |
|---|---|---|---|---|
| | Kodak 747+ | Waycoat SC++ | Kodak Microneg+++1350* | AZ- KPR** |
| 18 @ | 3 | 3 | 3 | 3 | — |
| 19 @ | 3 | 3 | 3 | 3 | — |
| 20 @ | 3 | 3 | 3 | 3 | — |
| 21 @ 115° C. | 5 | 4 | 4 | 4 | 8 |
| 22 @ 115° C. | 5 | 5 | 5 | 5 | 5 |
| 23 @ 115° C. | 5 | 4 | 4 | 4 | 8 |
| 24 @ 115° C. | 5 | 4 | 4 | 4 | 8 |
| 25 @ 115° C. | 5 | 5 | 4 | 4 | 5 |

TABLE 3-continued

| Composition of Example # | Stripping time in minutes Photoresist baked at 150° C. for 30 minutes | | | |
|---|---|---|---|---|
| | Waycoat Kodak 747[1] | SC[2] | Kodak Microneg[3] | AZ-1350* | KPR** |
| 26 @ 115° C. | 5 | 4 | 3 | 3 | 5 |

The photoresists used, identified above by their trademarks or trade names are believed to be as follows:
[†] Kodak Microresist 747 is a polyisoprene-type photoresist
[††] Hunt's Waycoat SC is a polyisoprene-type photoresist
[†††] Kodak Microneg is a polyisoprene-type photoresist
*Shipley AZ is phenol formaldehyde type photoresist
**Kodak KPR is a polyvinyl cinnamate-type photoresist

TABLE 4

| Alkylaryl compound | $R_1$ | $R_2$ | $R_3$ | $R_4$ |
|---|---|---|---|---|
| Toluene | $CH_3$ | H | H | H |
| Xylene | $CH_3$ | $CH_3$ | H | H |
| Ethylbenzene | $CH_2CH_3$ | H | H | H |
| Trimethylbenzene | $CH_3$ | $CH_3$ | $CH_3$ | H |
| Cumene | $CH(CH_3)_2$ | H | H | H |
| Phenyl octane | $(CH_2)_7CH_3$ | H | H | H |
| Dodecylbenzene | $(CH_2)_{11}CH_3$ | H | H | H |
| Phenyl nonane | $(CH_2)_8CH_3$ | H | H | H |
| Tridecylbenzene | $(CH_2)_{12}CH_3$ | H | H | H |
| Tridecyltoluene | $(CH_2)_{12}CH_3$ | $CH_3$ | H | H |
| Triethylbenzene | $CH_2CH_3$ | $CH_2CH_3$ | $CH_2CH_3$ | H |
| Tetradecylbenzene | $(CH_2)_3CH_3$ | H | H | H |
| Tetramethylbenzene | $CH_3$ | $CH_3$ | $CH_3$ | $CH_3$ |

TABLE 5

| Chlorinated aryl compound | $R_1$ | $R_2$ | $R_3$ |
|---|---|---|---|
| Dichlorobenzene | Cl | H | H |
| Trichlorobenzene | Cl | Cl | H |
| Trichlorotoluene | Cl | Cl | $CH_3$ |
| Dichloroethylbenzene | Cl | $CH_2CH_3$ | H |
| Chloroethylpropylbenzene | $CH_2CH_3$ | $(CH_2)_2CH_3$ | H |

I claim:

1. A stripping solution for removing polymeric organic substances from an inorganic substrate, said solution being essentially free of phenol compounds and comprising:

30-80 weight percent of an aryl sulfonic acid having the formula

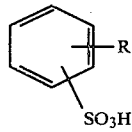

wherein R is hydrogen or an alkyl group containing 1 to 14 carbon atoms or mixtures thereof, and 20-70 weight percent of a solvent which includes a chlorinated aryl compound of the formula

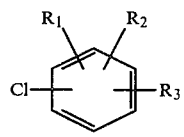

wherein $R_1$, $R_2$ and $R_3$ are each independently H, Cl or alkyl, and $R_1$, $R_2$ and $R_3$ together have 0-5 carbons.

2. The stripping solution as defined in claim 1 wherein the solvent further includes an alkyl aryl compound of the formula

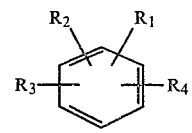

where $R_1$ is an alkyl group, $R_2$, $R_3$ and $R_4$ are independently hydrogen or an alkyl group and $R_1$, $R_2$, $R_3$ and $R_4$ together contain 1-14 carbon atoms.

3. The stripping solution as defined in claim 2 wherein the aryl sulfonic acid includes dodecylbenzene sulfonic acid.

4. The stripping solution as defined in claim 3 wherein the aryl sulfonic acid further includes toluene sulfonic acid.

5. The stripping solution as defined in claim 2 including dodecylbenzene as said alkylaryl compound.

6. The stripping solution as defined in claim 1 including dichlorobenzene as said chlorinated aryl compound.

7. The stripping solution as defined in claim 1 wherein the aryl sulfonic acid includes dodecylbenzene sulfonic acid.

8. The stripping solution as defined in claim 7 wherein the aryl sulfonic acid further includes toluene sulfonic acid.

9. The stripping solution of claim 1 wherein said aryl sulfonic acid is 5-10 weight percent toluene sulfonic acid and the remainder dodecylbenzene sulfonic acid.

10. A method for removing a photoresist organic polymer coating material from the surface of an inorganic substrate which comprises contacting said coated substrate for a time sufficient to loosen said coating with the stripping composition of claim 1.

11. A method for removing a photoresist organic polymer coating material from the surface of an inorganic substrate which comprises contacting said coated substrate for a time sufficient to loosen said coating with the stripping composition of claim 2.

12. A method for removing a photoresist organic polymer coating material from the surface of an inorganic substrate which comprises contacting said coated substrate for a time sufficient to loosen said coating with the stripping composition of claim 3.

13. A method for removing a photoresist organic polymer coating material from the surface of an inorganic substrate which comprises contacting said coated substrate for a time sufficient to loosen said coating with the stripping composition of claim 4.

14. A method for removing a photoresist organic polymer coating material from the surface of an inorganic substrate which comprises contacting said coated substrate for a time sufficient to loosen said coating with the stripping composition of claim 5.

15. A method for removing a photoresist organic polymer coating material from the surface of an inorganic substrate which comprises contacting said coated substrate for a time sufficient to loosen said coating with the stripping composition of claim 6.

16. A method for removing a photoresist organic polymer coating material from the surface of an inorganic substrate which comprises contacting said coated substrate for a time sufficient to loosen said coating with the stripping composition of claim 7.

17. A method for removing a photoresist organic polymer coating material from the surface of an inorganic substrate which comprises contacting said coated substrate for a time sufficient to loosen said coating with the stripping composition of claim 8.

18. A method for removing a photoresist organic polymer coating material from the surface of an inorganic substrate which comprises contacting said coated substrate for a time sufficient to loosen said coating with the stripping composition of claim 9.

19. A stripping solution for removing polymeric organic substances from an inorganic substrate, said solution being essentially free of phenol compounds and comprising:

30–80 weight percent of a mixture or aryl sulfonic acids of the formula

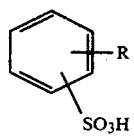

wherein R is hydrogen or an alkyl group containing 1 to 14 carbon atoms, said mixture of aryl sulfonic acids including dodecylbenzene sulfonic acid and toluene sulfonic acid, in admixture with 20–70 weight percent of a solvent which is chlorinated aryl compound of the formula

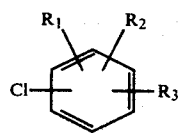

where $R_1$, $R_2$ and $R_3$ are each independently H, Cl or alkyl, and $R_1$, $R_2$ and $R_3$ together have 0–5 carbons;

an isoparaffinic hydrocarbon having an average molecular weight between 150 and 210 and a boiling point between 160° and 220° C.;

an alkylaryl compound of the formula

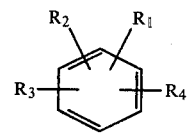

where $R_1$ is an alkyl group, $R_2$, $R_3$ and $R_4$ are independently hydrogen or an alkyl group and $R_1$, $R_2$, and $R_3$ and $R_4$ together contain 1–14 carbon atoms; or mixtures thereof;

said composition including 10–60 weight percent of at least one of said chlorinated aryl compounds and 10–60 weight percent of at least one of said alkylaryl compounds.

20. The stripping solution of claim 19 including 10–60 weight percent dodecylbenzene as said one alkylaryl compound and 10–60 weight percent dichlorobenzene as said one chlorinated aryl compound.

21. A method for removing a photoresist organic polymer coating material from the surface of an inorganic substrate which comprises contacting said coated substrate for a time sufficient to loosen said coating with the stripping composition of claim 19.

22. A method for removing a photoresist organic polymer coating material from the surface of an inorganic substrate which comprises contacting said coated substrate for a time sufficient to loosen said coating with the stripping composition of claim 20.

* * * * *